United States Patent [19]

Kemp et al.

[11] Patent Number: 5,292,623

[45] Date of Patent: Mar. 8, 1994

[54] METHOD FOR FORMING INTEGRATED CIRCUIT DEVICES USING A PHASE SHIFTING MASK

[75] Inventors: Kevin G. Kemp; Bernard J. Roman, both of Austin, Tex.

[73] Assignee: Motorola, Inc., Schaumburg, Ill.

[21] Appl. No.: 907,973

[22] Filed: Jul. 2, 1992

[51] Int. Cl.⁵ .................................................. G03F 7/00
[52] U.S. Cl. ........................................ 430/313; 430/5; 430/311
[58] Field of Search .................... 430/5, 311, 313, 314, 430/318, 319, 320, 321, 323, 328, 329, 330, 394, 396, 312

[56] References Cited

U.S. PATENT DOCUMENTS

| | | | |
|---|---|---|---|
| 4,568,631 | 2/1986 | Badami | 430/5 |
| 4,885,231 | 12/1989 | Chan | 430/321 |
| 5,045,417 | 9/1991 | Okamoto | 430/5 |
| 5,153,083 | 10/1992 | Garofalo | 430/313 |

FOREIGN PATENT DOCUMENTS 2-140743  5/1990  Japan ........................ H01L 21/27

OTHER PUBLICATIONS

"Improving Resolution in Photolithography with a Phase-Shifting Mask," by Levenson et al., IEEE Transactions on Electron Devices, vol. ED29, No. 12, Dec., 1982, pp. 1828–1836.

Primary Examiner—Marion E. McCamish
Assistant Examiner—Kathleen Duda
Attorney, Agent, or Firm—Kent J. Cooper; James L. Clingan, Jr.

[57] ABSTRACT

Integrated circuits with small feature sizes are obtained using a phase shifting mask which has reduced back reflection and improved optical contrast. These improvements result from reduced etching of the chrome and chrome oxide layers on the phase shifting mask. In one embodiment, the phase shifting mask is formed by depositing an image reversible photoresist layer (22) which overlies the optical mask (18). Forming a first exposed region (24) and an unexposed region (26) in the image reversible photoresist layer (22). Treating the first exposed region (24) to form a hardened first exposed region. Forming a second exposed region (30) within the remaining portion of the unexposed region (26) by exposing the back surface (16) of the substrate (12) to an optical illumination source. Removing the second exposed region (30) to uncover a portion (32) of the substrate (12) and to form an etch mask (34). The uncovered portion (32) of the substrate (12) is etched to form a trench region (38).

15 Claims, 6 Drawing Sheets

OPTICAL IMAGING SOURCE

1

METHOD FOR FORMING INTEGRATED CIRCUIT DEVICES USING A PHASE SHIFTING MASK

FIELD OF THE INVENTION

This invention relates generally to semiconductor devices, and more generally to a process for forming integrated circuit devices using a phase shifting mask.

BACKGROUND OF THE INVENTION

The semiconductor industry's continuing drive toward advanced integrated circuits with increased performance and higher device packing densities has required an accompanying decrease in the minimum feature size of devices. Therefore, each new generation of advanced integrated circuit has required an increase in lithographic resolution. Traditionally, optical lithography has been used to define integrated circuit patterns on semiconductor substrates.

Optical lithography uses a transmission mask in conjunction with a light source to define patterns in a photoresist layer overlying a semiconductor substrate. A conventional transmission mask usually consists of a quartz substrate covered by an opaque composite layer of chrome and chrome oxide that has open slits or apertures defined within it. The chrome oxide that lies on the top surface of the chrome serves as an anti-reflective coating and is essential for high resolution optical lithography because it minimizes the back reflection of light from the mask. A specific configuration or layout of apertures within the composite chrome layer is used to define a specific integrated circuit pattern. The integrated circuit pattern on a transmission mask is transferred to a photoresist coated semiconductor substrate by placing the substrate under the transmission mask, which is then illuminated with a light source. Light passing through the apertures on the transmission mask causes a pattern to be photochemically defined in the photoresist layer. If the photoresist layer has a positive tone, subsequent development of the photoresist layer results in the exposed portion, or the photochemically transformed portion, to be selectively removed with respect to the unexposed portion of the photoresist layer. For a negative tone photoresist, the unexposed portions of the photoresist layer would be selectively removed with respect to the exposed portions of photoresist layer. In either case, the transfer of the integrated circuit pattern from the transmission mask to the photoresist layer, however, is not perfect. This becomes especially true as the distance separating adjacent apertures on the transmission mask decreases.

When light passes through an aperture on the transmission mask, it is diffracted by the composite chrome layer. This results in a partial illumination of the area surrounding the aperture, in addition to the illumination of the area located directly underneath the aperture. Therefore, as the distance between two adjacent apertures is decreased, the light diffracted from each of the apertures constructively interferes. On the semiconductor substrate, this results in the unwanted exposure of photoresist that lies between two exposed regions such that the resulting integrated circuit pattern is either smaller or larger than desired. Consequently, the ability to optically resolve a photoresist pattern with closely spaced features is degraded. Therefore, the continuing reduction of device feature sizes, as required for advanced integrated circuits, is limited.

Phase shifting masks, however, have been proposed for the fabrication of advanced integrated circuits because of their ability to improve the resolution of optical lithography. Phase shifting masks make use of the fact that out of phase light waves destrictively interfere with one another. For example, if the light passing through an aperture is 180 degrees out of phase with light passing through an adjacent aperture, then the diffracted light from both apertures destructively interferes and is canceled in the region between the adjacent apertures. As a result, photoresist patterns with closely spaced features can be resolved.

Although the basic principle of using phase shifting masks to achieve improved optical resolution is relatively straight forward, the actual fabrication of phase shifting masks is more difficult. Many phase shifting masks use a composite layer of chrome and chrome oxide to define phase shifting apertures, similar to transmission masks. Phase shifting masks differ from transmission masks in that the substrate is contoured and non-planar. Thus the substrate is thicker in some areas than in others. The purpose of using a substrate with varying, but controlled, thickness is to achieve the destructive interference associated with phase shifting. Phase shifting is accomplished by decreasing or increasing the path length of light traveling through an aperture with respect to an adjacent aperture. The path length of light traveling through an aperture can be changed by changing the thickness of the substrate appropriately. Typically, thickness differences across a substrate have traditionally been accomplished by forming trenches in the substrate. Thickness differences, however, can also be achieved by forming trenches in a phase shifting layer which overlies the substrate, and which has optical properties which are nearly the same as the substrate. Unfortunately, the existing etches used to form the trenches also etch portions of the chrome oxide anti-reflective coating and thins or roughens the underlying chrome layer. Therefore, chrome-based phase shifting masks suffer from high back reflection and from degraded transmission profiles, since portions of the composite chrome mask are etched. Consequently, the formation of advanced integrated circuits using chrome-based phase shifting masks is limited. Accordingly, a need exists for a process that forms trenched phase shifting apertures, on chrome-based masks, with reduced or no etching of the composite chrome mask.

SUMMARY OF THE INVENTION

The previously mentioned problems with fabricating advanced integrated circuits with existing chrome-based phase shifting masks are overcome by the present invention. In one form of the invention, an integrated circuit device is fabricated by providing a phase shifting mask which is fabricated in accordance with a method comprising the steps of providing a substrate that is transparent to ultraviolet radiation with a wavelength greater than 190 nanometers. The substrate also having a front surface and a back surface. Forming an optical mask overlying the front surface of the substrate, which is opaque to ultraviolet radiation with a wavelength greater than 190 nanometers. Depositing an image reversible photoresist layer which is overlying the optical mask. Forming a first exposed region and an unexposed region in the image reversible photoresist layer. The first exposed region having a sidewall that overlies a portion of the optical mask. Treating the first exposed region to form a hardened first exposed region. Forming a second exposed region within a remaining portion of the unexposed region by exposing the back surface of the substrate to an optical illumination source. Removing the second exposed portion to uncover a portion of the substrate and to form an etch mask. The etch mask comprising the hardened first exposed region and the remaining portion of the unexposed region. Etching the uncovered portion of the substrate to form a trench region and removing the etch mask to form the phase shifting mask. Providing a semiconductor substrate and coating the semiconductor substrate with a photoresist layer to form a photoresist coated semiconductor substrate. Placing the phase shifting mask adjacent to the photoresist coated semiconductor substrate and transmitting light through a portion of the phase shifting mask to define an exposure pattern in the photoresist layer and developing the photoresist layer to form a photoresist mask overlying the semiconductor substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Embodiment I

Figure 1:
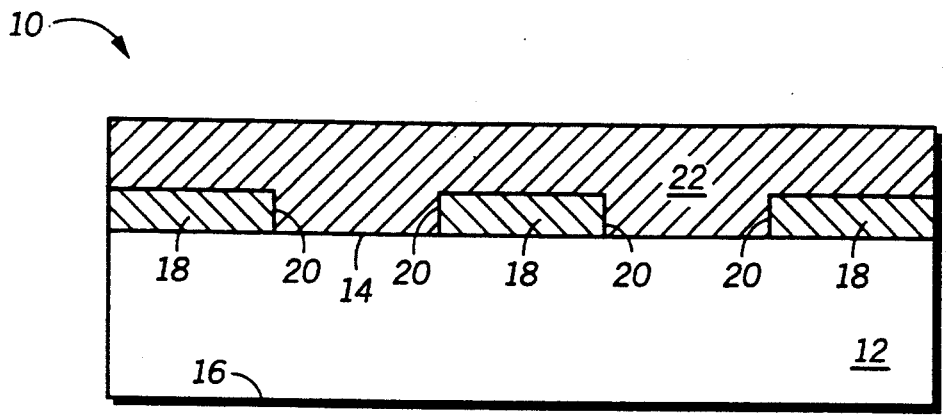
FIGS. 1-5 illustrate, in cross-section, process steps in accordance with one embodiment of the invention.

FIGS. 1 through 5 illustrate, in cross-section, process steps in accordance with one embodiment of the invention wherein a phase shifting mask is formed. Shown in FIG. 1 is a portion 10 of a phase shifting mask comprising a substrate 12 having a front surface 14 and a back surface 16, an optical mask 18 having a sidewall 20, and an image reversible photoresist layer 22 which overlies optical mask 18. Substrate 12 is preferably synthetically fabricated quartz. Alternatively, substrate 12 may be another material which is also transparent to ultraviolet radiation with a wavelength greater than 190 nanometers such as calcium fluoride. Optical mask 18 is preferably a conventional laminated chrome mask consisting of an anti-reflecting layer of chrome oxide overlying a layer of chrome and is formed using conventional chrome mask making techniques. Alternatively, optical mask 18 may be formed with other materials which are also opaque to ultraviolet radiation with a wavelength greater than 190 nanometers. Image reversible photoresist layer 22 is preferably AZ5200 photoresist, which is deposited using conventional photoresist coating techniques. Alternatively, other image reversible photoresists may be used.

Figure 2:
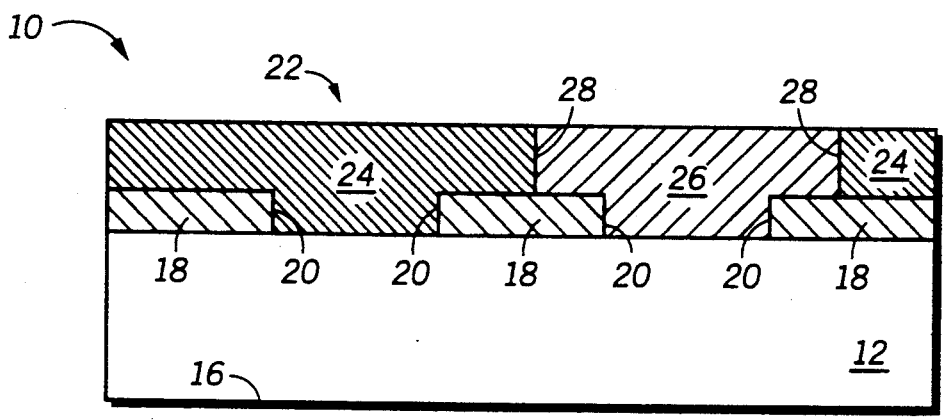

The process continues with the formation of a first exposed region 24 and an unexposed region 26 in image reversible photoresist layer 22. First exposed region 24 is preferably formed using conventional electron beam lithography techniques. Alternatively, first exposed region 24 may also be formed using direct write optical lithography techniques. First exposed region 24 has a sidewall 28 which overlies a portion of optical mask 18, as shown in FIG. 2.

Figure 3:
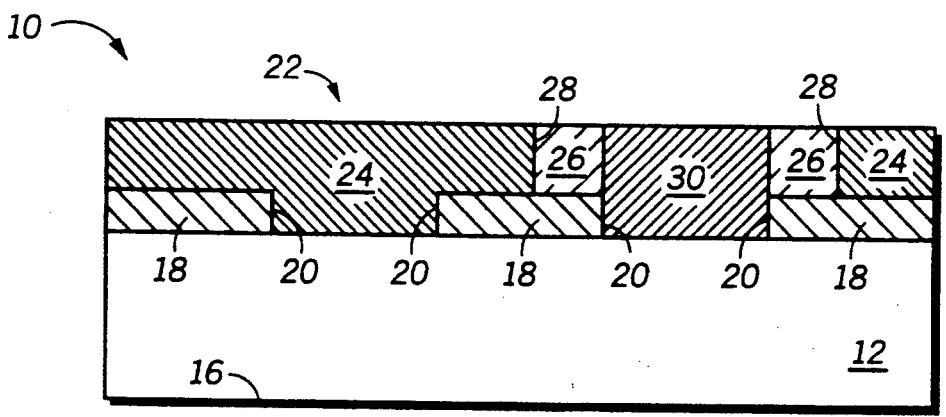
Figure 3:

Referring to FIG. 3, the process continues with a conventional post exposure bake treatment of image reversible photoresist layer 22. The post exposure bake heats first exposed region 24 and causes first exposed region 24 to undergo a chemical transformation which results in first exposed region 24 becoming hardened or etch resistant. Alternatively, for some image reversible photoresists, first exposed region 24 may be hardened by a post exposure bake followed by an exposure of first exposed region 24 to an amine vapor or an ambient comprising a gas having an elemental composition including nitrogen and hydrogen. After first exposed region 24 is hardened, back surface 16 of substrate 12 is flood exposed with an optical illumination source. For example, back surface 16 may be flood exposed with a mercury discharge lamp. The flood exposure forms a second exposed region 30 which lies within a remaining portion of unexposed region 26.

Figure 4:
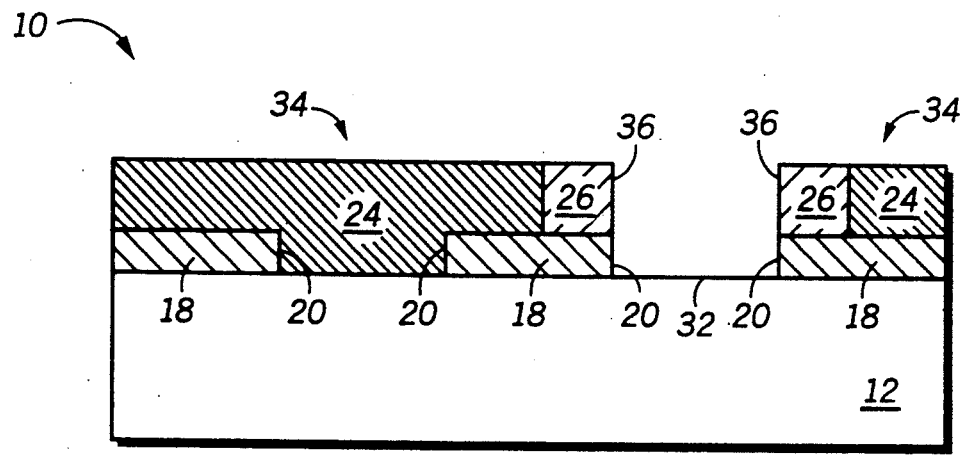

Second exposed region 30 is then selectively removed using a conventional alkaline based photoresist developer, such as AZ 400K, to uncover a portion 32 of substrate 12. First exposed region 24, which is hardened, and the remaining portion of unexposed region 26 are substantially unaltered by the photoresist developer and are left behind to form an etch mask 34. The sidewall 36 of etch mask 34 is self-aligned to sidewall 20 of optical mask 18, as shown in FIG. 4.

Figure 5:
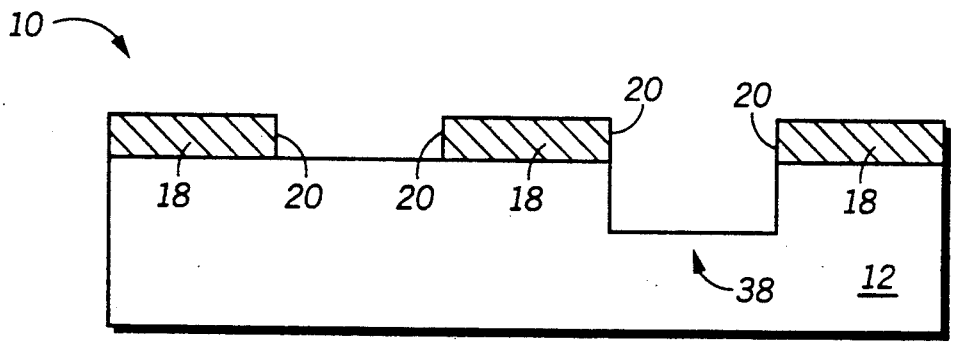

Referring to FIG. 5, portion 32 of substrate 12 is then anisotropically etched to form a trench region 38 which is self aligned to sidewall 20 of optical mask 18. The depth of trench region 38 is customized to the degree of phase shifting that is desired, and to the exposure wavelength of the optical imaging source which will be used in conjunction with the phase shifting mask to define integrated circuit patterns on a semiconductor substrate. Etch mask 32 is then removed, using conventional photoresist stripping techniques.

Embodiment II

Figure 6:
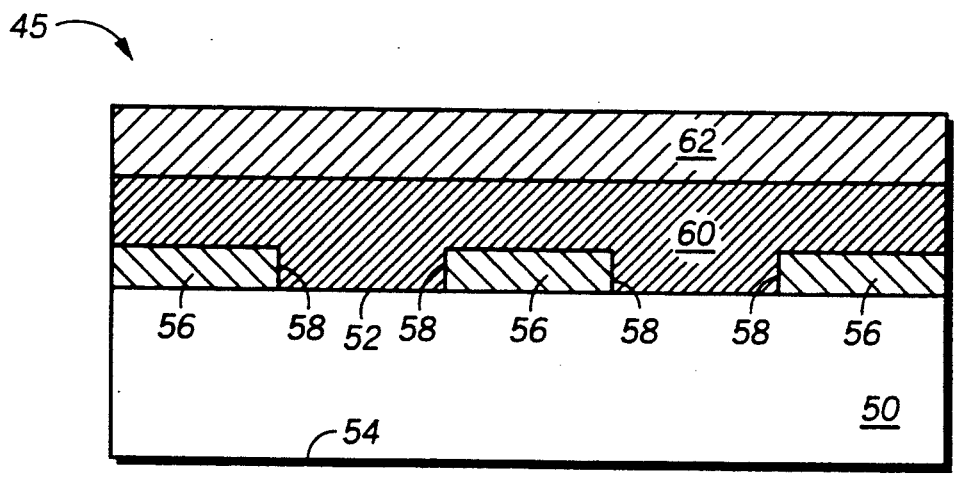
FIGS. 6-10 illustrate, in cross-section, process steps in accordance with a second embodiment of the invention.

FIGS. 6 through 10 illustrate, in cross-section, process steps in accordance with a second embodiment of the invention wherein a phase shifting mask is formed. Shown in FIG. 6 is a portion 45 of a phase shifting mask comprising a substrate 50 having a front surface 52 and a back surface 54 analogous to substrate 12 in FIG. 1, an optical mask 56 having a sidewall 58 analogous to optical mask 18 in FIG. 1, a phase shifting layer 60, and an image reversible photoresist layer 62 analogous to image reversible photoresist layer 22 in FIG. 1. Phase shifting layer 60 overlies optical mask 56 and is preferably a silicon dioxide film which is formed using conventional deposition techniques. For example, phase shifting layer 60 may be formed by chemical vapor deposition or by using spin-on-glass (SOG). Alternatively, phase shifting layer 60 may be formed with other materials which have a refractive index similar to that of substrate 50 and which are transparent to ultraviolet radiation with a wavelength greater than 190 nanometers. After phase shifting layer 60 has been formed, image reversible photoresist layer 62 is deposited over it.

Figure 7:
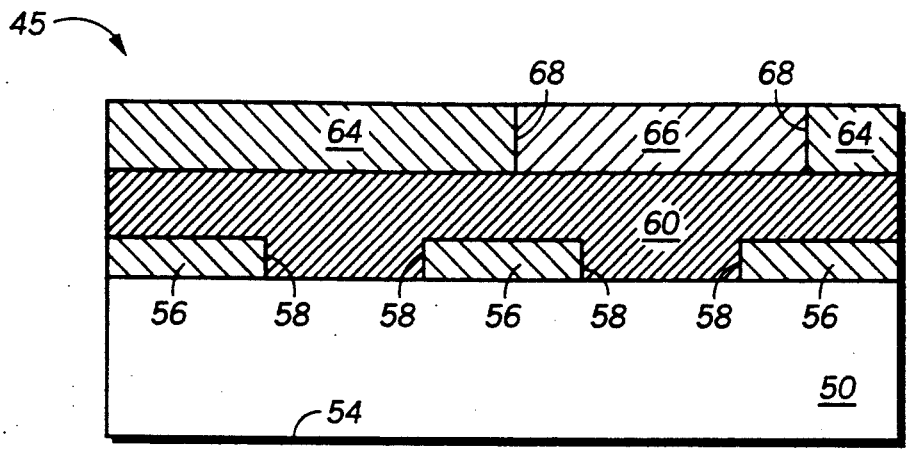

The process continues with the formation of a first exposed region 64 and an unexposed region 66 in image reversible photoresist layer 62. First exposed region 64 is preferably formed using conventional electron beam lithography techniques. Alternatively, first exposed region 64 may also be formed using direct write optical lithography techniques. First exposed region 64 has a sidewall 68 which overlies a portion of optical mask 56, as shown in FIG. 7.

Figure 8:
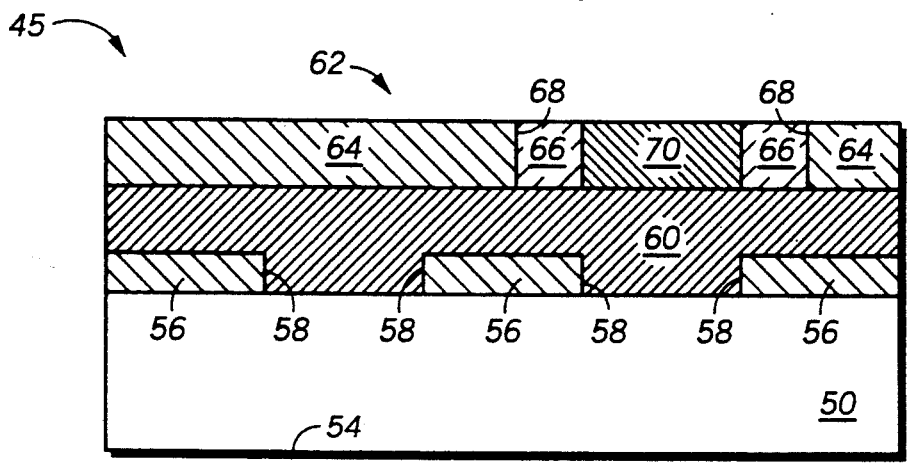

Referring to FIG. 8, the process continues with a conventional post exposure bake treatment of image reversible photoresist layer 62. The post exposure bake heats first exposed region 64 and causes first exposed region 64 to undergo a chemical transformation which results in first exposed region 64 becoming hardened or etch resistant. Alternatively, for some image reversible photoresists, first exposed region 64 may be hardened by a post exposure bake followed by an exposure of first exposed region 64 to an amine vapor or an ambient comprising a gas having an elemental composition including nitrogen and hydrogen. After first exposed region 64 is hardened, back surface 54 of substrate 50 is flood exposed with an optical illumination source. For example, back surface 54 may be flood exposed with a mercury discharge lamp. The flood exposure forms a second exposed region 70 which lies within a remaining portion of unexposed region 66.

Figure 9:
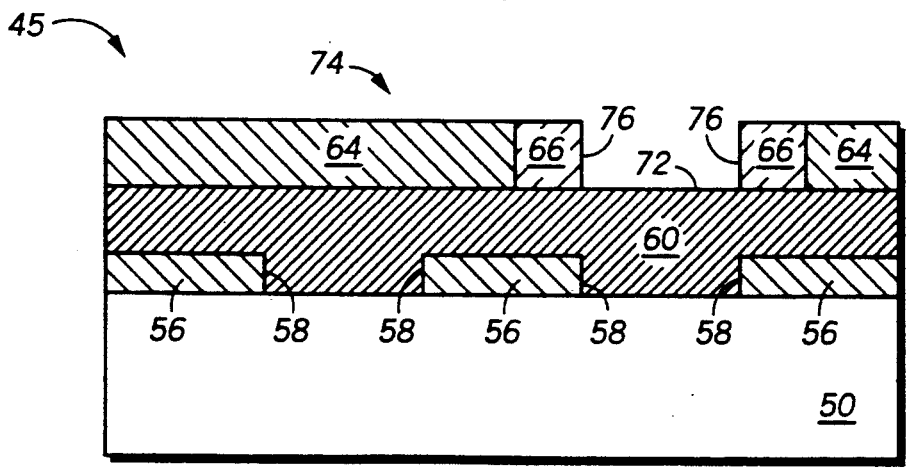

Second exposed region 70 is then selectively removed using a conventional alkaline based photoresist developer to uncover a portion 72 of phase shift layer 60. First exposed region 64, which is hardened, and the remaining portion of unexposed region 66 are substantially unaltered by the photoresist developer and are left behind to form an etch mask 74. The sidewall 76 of etch mask 74 is self-aligned to sidewall 58 of optical mask 56, as shown in FIG. 9.

Figure 10:
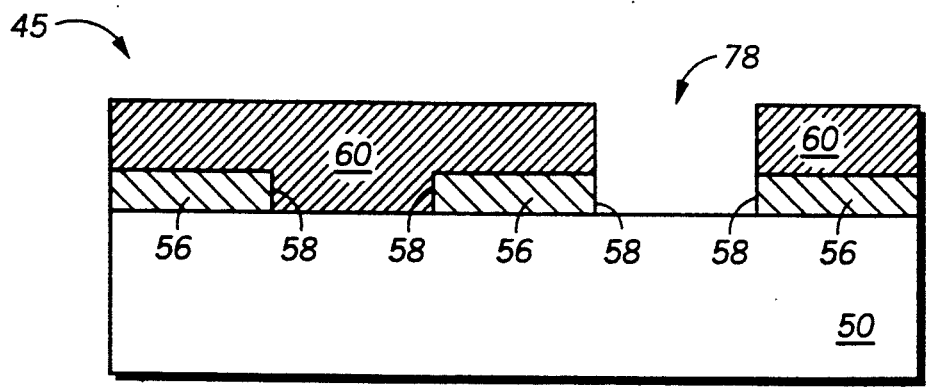

Referring to FIG. 10, portion 72 of phase shifting layer 60 is then anisotropically etched to form a trench region 78 which is self aligned to sidewall 58 of optical mask 56. The depth of trench region 78 is customized to the degree of phase shifting that is desired, and to the exposure wavelength of the optical imaging source which will be used in conjunction with the phase shifting mask to define integrated circuit patterns on a semiconductor substrate. Etch mask 74 is then removed using conventional photoresist stripping techniques.

Embodiment III

Figure 11:
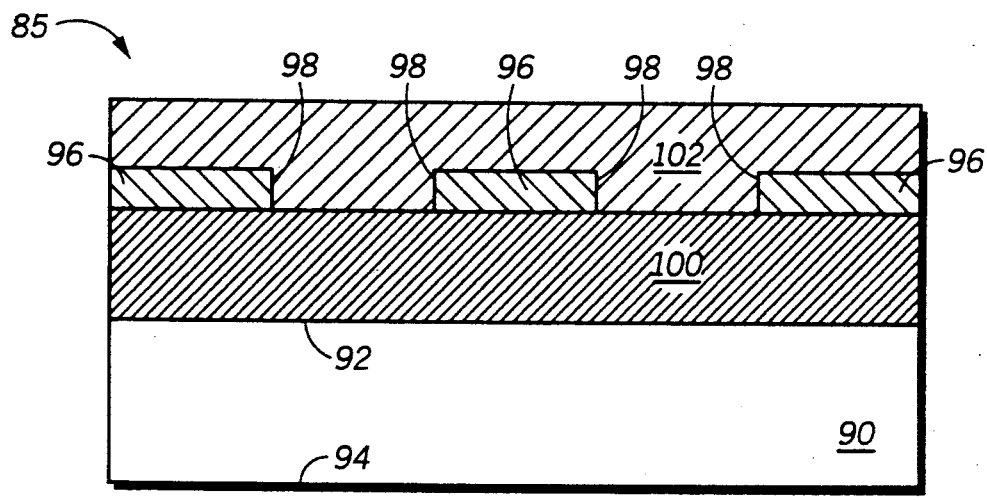
FIGS. 11-15 illustrate, in cross-section, process steps in accordance with a third embodiment of the invention.

FIGS. 11 through 15 illustrate, in cross-section, process steps in accordance with a third embodiment of the invention wherein a phase shifting mask is formed. Shown in FIG. 11 is a portion 85 of a phase shifting mask comprising a substrate 90 having a front surface 92 and a back surface 94 analogous to substrate 12 in FIG. 1, an optical mask 96 having a sidewall 98 analogous to optical mask 18 in FIG. 1, a phase shifting layer 100 analogous to phase shifting layer 60 in FIG. 6, and an image reversible photoresist layer 102 analogous to image reversible photoresist layer 22 in FIG. 1. In this embodiment, the phase shifting layer underlies the optical mask instead of overlying it, as previously described in the second embodiment. After optical mask 96 is formed, over phase shifting layer 100, image reversible photoresist layer 102 is then deposited over it.

Figure 12:
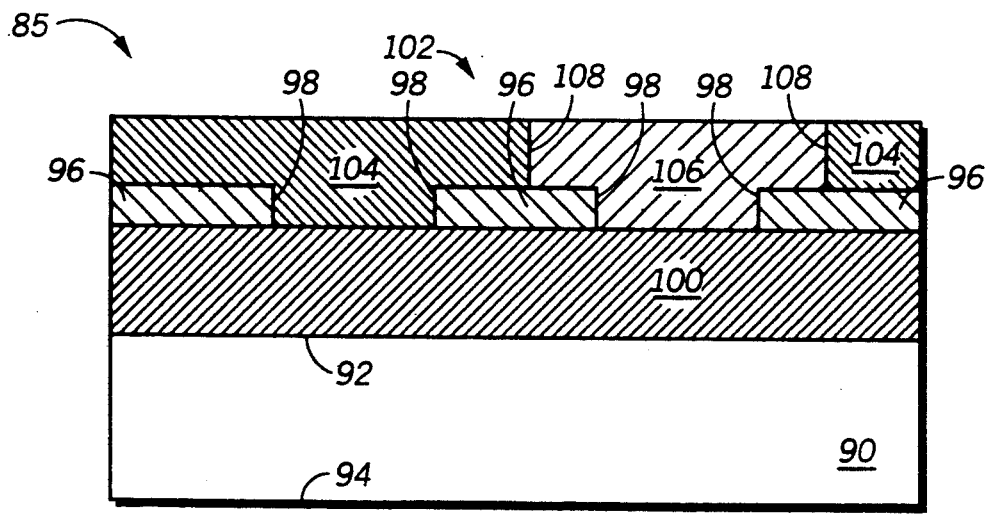

The process continues with the formation of a first exposed region 104 and an unexposed region 106 in image reversible photoresist layer 102. First exposed region 104 is preferably formed using conventional electron beam lithography techniques. Alternatively, first exposed region 104 may also be formed using direct write optical lithography techniques. First exposed region 104 has a sidewall 108 which overlies a portion of optical mask 96, as shown in FIG. 12.

Figure 13:
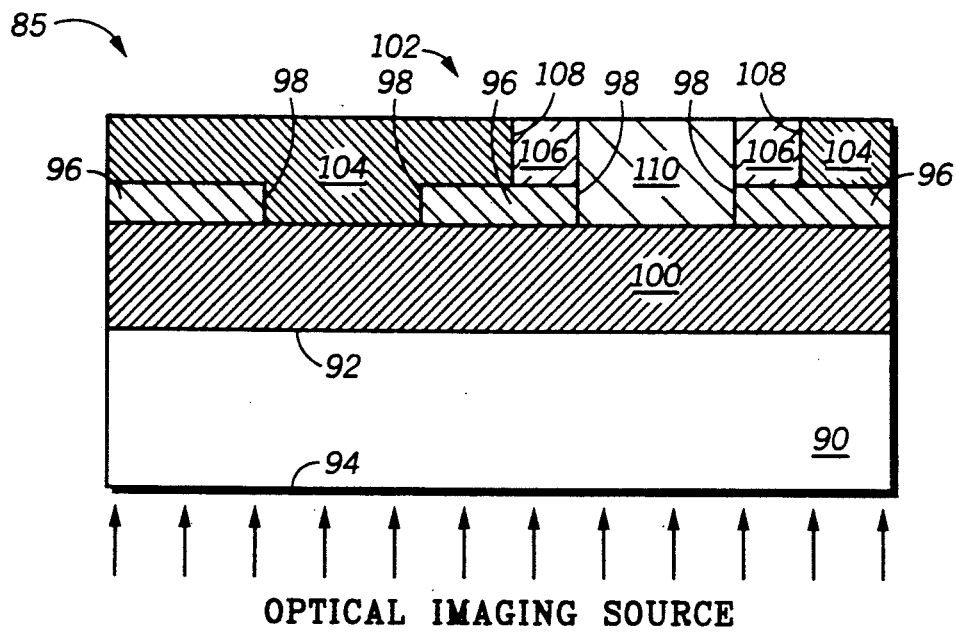

Referring to FIG. 13, the process continues with a conventional post exposure bake treatment of image reversible photoresist layer 102. The post exposure bake heats first exposed region 104 and causes first exposed region 104 to undergo a chemical transformation which results in first exposed region 104 becoming hardened or etch resistant. Alternatively, for some image reversible photoresists, first exposed region 104 may be hardened by a post exposure bake followed by an exposure of first exposed region 104 to an amine vapor or an ambient comprising a gas having an elemental composition including nitrogen and hydrogen. After first exposed region 104 is hardened, back surface 94 of substrate 90 is flood exposed with an optical illumination source. For example, back surface 94 may be flood exposed with a mercury discharge lamp. The flood exposure forms a second exposed region 110 which lies within a remaining portion of unexposed region 106.

Figure 14:
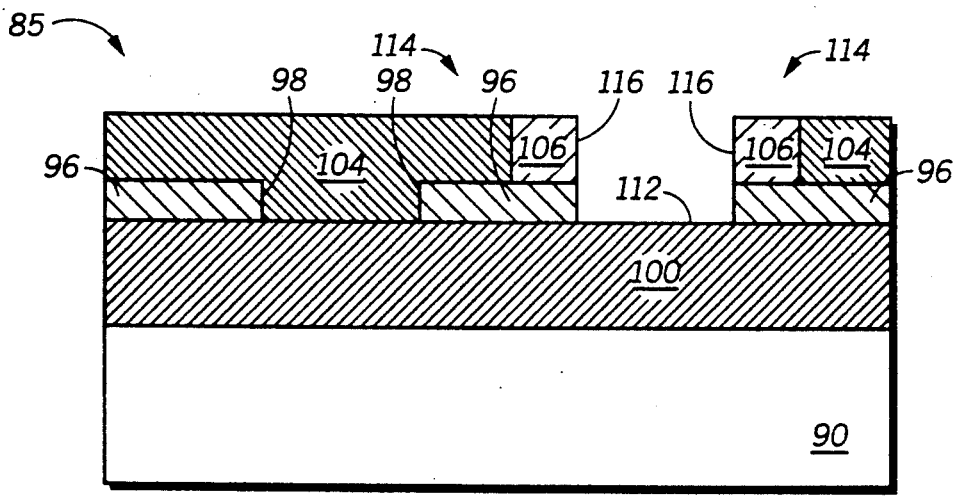

Second exposed region 110 is then selectively removed using a conventional alkaline based photoresist developer to uncover a portion 112 of phase shift layer 100. First exposed region 104, which is hardened, and the remaining portion of unexposed region 106 are substantially unaltered by the photoresist developer and are left behind to form an etch mask 114. The sidewall 116 of etch mask 114 is self-aligned to sidewall 98 of optical mask 96, as shown in FIG. 14.

Figure 15:
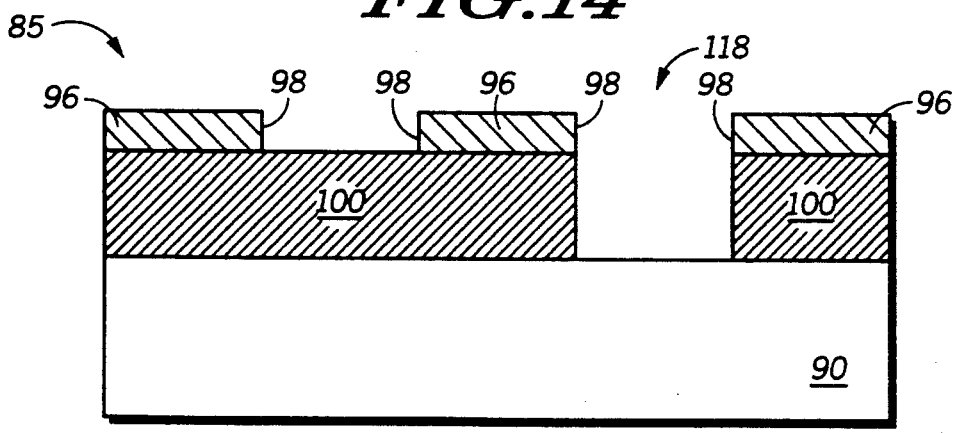

Referring to FIG. 15, portion 112 of phase shifting layer 100 is then anisotropically etched to form a trench region 118 which is self aligned to sidewall 98 of optical mask 96. The depth of trench region 118 is customized to the degree of phase shifting that is desired, and to the exposure wavelength of the optical imaging source which will be used in conjunction with the phase shifting mask to define integrated circuit patterns on a semiconductor substrate. Etch mask 114 is then removed using conventional photoresist stripping techniques.

Fabrication of Semiconductor Device Using Phase Shifting Mask

Figure 16:
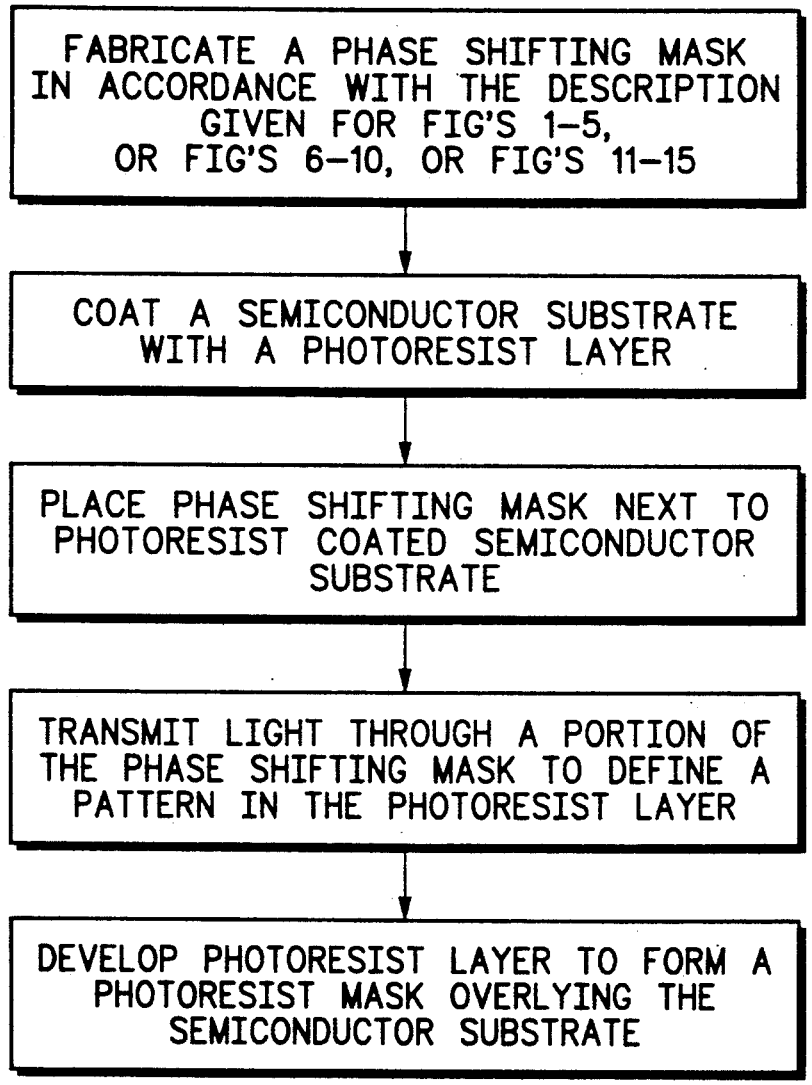
FIG. 16 illustrates a process flow diagram for the fabrication of an integrated circuit device.

Shown in FIG. 16 is a process flow diagram wherein a phase shifting mask is used to fabricate an integrated circuit device. A phase shifting mask is fabricated in accordance with the description given for FIGS. 1-5, or FIGS. 6-10, or FIGS. 11-15. A semiconductor substrate is then coated with a photoresist layer. The semiconductor substrate may have overlying devices or device layers such as polysilicon, oxide, metal, etcetera, as well as trench and diffusion regions or the like. The photoresist coated semiconductor substrate is then placed adjacent to the phase shifting mask. Light is then transmitted through the transparent portion of the phase shifting mask and imaged onto the photoresist coated semiconductor substrate to define an exposure pattern in the photoresist layer. The photoresist layer is then subsequently developed to form a photoresist mask which overlies the semiconductor substrate. The photoresist mask can then be used either in conjunction with ion implantation to form implanted regions in the semiconductor substrate, or can be used in conjunction with conventional wet or dry etches to transfer the pattern into the semiconductor substrate.

The foregoing description and illustrations contained herein demonstrate many of the advantages associated with the present invention. One advantage is that a self-aligned etch mask is formed adjacent to the region, which is going to be trenched, as shown in FIG. 4. Therefore, during trench formation portions of the optical mask which are located adjacent to the trench region are protected from the etch. As a result, the composite mask of chrome and chrome oxide is not damaged, as would typically be the case, since existing techniques do not self-align the etch mask to the trench region. Moreover, since the composite chrome mask is not damaged back reflection of light off the phase shifting mask is minimized. Additionally, a sharp transmission profile is also preserved at the edge of the composite chrome mask. Therefore, optical resolution is improved and integrated circuit devices with small feature sizes can be fabricated using the phase shifting mask. Furthermore, only a single layer of photoresist is required for the process. Therefore, phase shifting masks with low defect densities can be fabricated.

Thus it is apparent that there has been provided, in accordance with the invention, a method for forming a phase shifting mask that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is envisioned that with material advances a silylation process may be used to form a phase shifting mask in a manner similar to that discussed in FIGS. 1-5, FIGS. 6-10, and FIGS. 11-15. Additionally, in some applications an etch stop layer may be deposited underneath the phase shifting layer. In addition, the invention is not limited to the materials specifically described. Although preferred materials have been recited it is envisioned that numerous materials may be suitable for the different elements of the present invention. Therefore, it is intended that this invention encompass all such variations and modifications as fall within the scope of the appended claims.

We claim:

1. A device fabrication method comprising the steps of:
   providing a substrate wherein the substrate is transparent to ultraviolet radiation with a wavelength greater than 190 nanometers, the substrate having a front surface and a back surface;
   forming an optical mask overlying the front surface of the substrate, the optical mask being opaque to ultraviolet radiation with a wavelength greater than 190 nanometers;
   depositing an image reversible photoresist layer overlying the optical mask;
   forming a first exposed region and an unexposed region in the image reversible photoresist layer, the first exposed region having a sidewall wherein the sidewall overlies a portion of the optical mask;
   treting the first exposed region to form a hardened first exposed region;
   exposing the back surface of the substrate to an optical illumination source, wherein radiation from the optical illumination source passes through a portion of the substrate to form a second exposed region that lies within a remaining portion of the unexposed region;
   removing the second exposed region to uncover a portion of the substrate and to form an etch mask, the etch mask comprising the hardened first exposed region and the remaining portion of the unexposed region;
   etching the uncovered portion of the substrate to form a trench region; and
   removing the etch mask to form a phase shifting mask.

2. The method of claim 1, wherein the step of forming the optical mask is further characterized as forming the optical mask of chrome with an overlying layer of chrome oxide.

3. The method of claim 1, wherein the step of treating the first exposed region comprises the step of:
   heating the first exposed region to form a hardened first exposed region.

4. The method of claim 1, wherein the step of treating the first exposed region comprises the steps of:
   heating the first exposed region; and
   exposing the first exposed region to an amine vapor to form a hardened first exposed region.

5. A device fabrication method comprising the steps of:
   providing a substrate wherein the substrate is transparent to ultraviolet radiation with a wavelength greater than 190 nanometers, the substrate having a front surface and a back surface;
   forming a phase shifting layer of material overlying the front surface of the substrate, the phase shifting layer being transparent to ultraviolet radiation with a wavelength greater than 190 nanometers;
   forming an optical mask overlying the the phase shifting layer, the optical mask being opaque to ultraviolet radiation with a wavelength greater than 190 nanometers;
   depositing an image reversible photoresist layer overlying the optical mask;
   forming a first exposed region and an unexposed region in the image reversible photoresist layer, the first exposed region having a sidewall wherein the sidewall overlies a portion of the optical mask;
   treating the first exposed region to form a hardened first exposed region;
   exposing the back surface of the substrate to an optical illumination source, wherein radiation from the optical illumination source passes through a portion of the substrate to form a second exposed region that lies within a remaining portion of the unexposed region;
   removing the second exposed region to uncover a portion of the phase shifting layer and to form an etch mask, the etch mask comprising the hardened first exposed region and the remaining portion of the unexposed region;
   etching the uncovered portion of the phase shifting layer to form a trench region; and
   removing the etch mask to form a phase shifting mask.

6. The method of claim 5, wherein the step of forming the optical mask is further characterized as forming the optical mask of chrome with an overlying layer of chrome oxide.

7. The method of claim 5, wherein the step of treating the first exposed region comprises the step of:

heating the first exposed region to form a hardened first exposed region.

8. The method of claim 5, wherein the step of treating the first exposed region comprises the steps of:
   heating the first exposed region; and
   exposing the first exposed region to an amine vapor to form a hardened first exposed region.

9. A method of fabricating an integrated circuit comprising the steps of:
   providing a substrate wherein the substrate is transparent to ultraviolet radiation with a wavelength greater than 190 nanometers, the substrate having a front surface and a back surface;
   forming a phase shifting layer of material overlying the front surface of the substrate, the phase shifting layer being transparent to ultraviolet radiation with a wavelength greater than 190 nanometers;
   forming an optical mask overlying the phase shifting layer, the optical mask being opaque to ultraviolet radiation with a wavelength greater than 190 nanometers;
   depositing an image reversible photoresist layer overlying the optical mask;
   forming a first exposed region and an unexposed region in the image reversible photoresist layer, the first exposed region having a sidewall wherein the sidewall overlies a portion of the optical mask;
   treating the first exposed region to form a hardened first exposed region;
   exposing the back surface of the substrate to an optical illumination source, wherein radiation from the optical illumination source passes through a portion of the substrate to form a second exposed region that lies within a remaining portion of the unexposed region;
   removing the second exposed region to uncover a portion of the phase shifting layer and to form an etch mask, the etch mask comprising the hardened first exposed region and the remaining portion of the unexposed region;
   etching the uncovered portion of the phase shifting layer to form a trench region; and
   removing the etch mask to form a phase shifting mask;
   providing a semiconductor substrate;
   coating the semiconductor substrate with a photoresist layer to form a photoresist coated semiconductor substrate;
   placing the phase shifting mask adjacent to the photoresist coated semiconductor substrate;
   transmitting light through a portion of the phase shifting mask to define an exposure pattern in the photoresist layer; and
   developing the photoresist layer to form a photoresist mask overlying the semiconductor substrate.

10. A method of fabricating an integrated circuit comprising the steps of:
    providing a substrate wherein the substrate is transparent to ultraviolet radiation with a wavelength greater than 190 nanometers, the substrate having a front surface and a back surface;
    forming an optical mask overlying the front surface of the substrate, the optical mask being opaque to ultraviolet radiation with a wavelength greater than 190 nanometers;
    depositing an image reversible photoresist layer overlying the optical mask;
    forming a first exposed region and an unexposed region in the image reversible photoresist layer, the first exposed region having a sidewall wherein the sidewall overlies a portion of the optical mask;
    treating the first exposed region to form a hardened first exposed
    exposing the back surface of the substrate to an optical illumination source, wherein radiation from the optical illumination source passes through a portion of the substrate to form a second exposed region that lies within a remaining portion of the unexposed region;
    removing the second exposed region to uncover a portion of the substrate and to form an etch mask, the etch mask comprising the hardened first exposed region and the remaining portion of the unexposed region;
    etching the uncovered portion of the substrate to form a trench region; and
    removing the etch mask to form a phase shifting mask;
    providing a semiconductor substrate;
    coating the semiconductor substrate with a photoresist layer to form a photoresist coated semiconductor substrate;
    placing the phase shifting mask adjacent to the photoresist coated semiconductor substrate;
    transmitting light through a portion of the phase shifting mask to define an exposure pattern in the photoresist layer; and
    developing the photoresist layer to form a photoresist mask overlying the semiconductor substrate.

11. A device fabrication method comprising the steps of:
    providing a substrate wherein the substrate is transparent to ultraviolet radiation with a wavelength greater than 190 nanometers, the substrate having a front surface and a back surface;
    forming an optical mask overlying the front surface of the substrate, the optical mask being opaque to ultraviolet radiation with a wavelength greater than 190 nanometers;
    forming a phase shifting layer of material overlying the optical mask, the phase shifting layer being transparent to ultraviolet radiation with a wavelength greater than 190 nanometers;
    depositing an image reversible photoresist layer overlying the phase shifting layer;
    forming a first exposed region and an unexposed region in the image reversible photoresist layer, the first exposed region having a sidewall wherein the sidewall overlies a portion of the optical mask;
    treating the first exposed region to form a hardened first exposed region;
    exposing the back surface of the substrate to an optical illumination source, wherein radiation from the optical illumination source passes through a portion of the substrate to form a second exposed region that lies within a remaining portion of the unexposed region;
    removing the second exposed region to uncover a portion of the phase shifting layer and to form an etch mask, the etch mask comprising the hardened first exposed region and the remaining portion of the unexposed region;
    etching the uncovered portion of the phase shifting layer to form a trench region; and removing the etch mask to form a phase shifting mask.

12. The method of claim 11, wherein the step of forming the optical mask is further characterized as forming the optical mask of chrome with an overlying layer of chrome oxide.

13. The method of claim 11, wherein the step of treating the first exposed region comprises the step of:
heating the first exposed region to form a hardened first exposed region.

14. The method of claim 11, wherein the step of treating the first exposed region comprises the steps of:
heating the first exposed region; and
exposing the first exposed region to an amine vapor to form a hardened first exposed region.

15. A method of fabricating an integrated circuit comprising the steps of:
providing a substrate wherein the substrate is transparent to ultraviolet radiation with a wavelength greater than 190 nanometers, the substrate having a front surface and a back surface;
forming an optical mask overlying the front surface of the substrate, the optical mask being opaque to ultraviolet radiation with a wavelength greater than 190 nanometers;
forming a phase shifting layer of material overlying the optical mask, the phase shifting layer being transparent to ultraviolet radiation with a wavelength greater than 190 nanometers;
depositing an image reversible photoresist layer overlying the phase shifting layer;
forming a first exposed region and an unexposed region in the image reversible photoresist layer, the first exposed region having a sidewall wherein the sidewall overlies a portion of the optical mask;
treating the first exposed region to form a hardened first exposed region;
forming a second exposed region wherein the second exposed region lies within a remaining portion of the unexposed region and is formed by exposing the back surface of the substrate to an optical illumination source;
removing the second exposed region to uncover a portion of the phase shifting layer and to form an etch mask, the etch mask comprising the hardened first exposed region and the remaining portion of the unexposed region;
etching the uncovered portion of the phase shifting layer to form a trench region; and
removing the etch mask to form a phase shifting mask;
providing a semiconductor substrate;
coating the semiconductor substrate with a photoresist layer to form a photoresist coated semiconductor substrate;
placing the phase shifting mask adjacent to the photoresist coated semiconductor substrate;
transmitting light through a portion of the phase shifting mask to define an exposure pattern in the photoresist layer; and
developing the photoresist layer to form a photoresist mask overlying the semiconductor substrate.

* * * * *

UNITED STATES PATENT AND TRADEMARK OFFICE
CERTIFICATE OF CORRECTION

PATENT NO. : 5,292,623
DATED : March 8, 1994
INVENTOR(S) : Kevin G. Kemp et al.

It is certified that error appears in the above-indentified patent and that said Letters Patent is hereby corrected as shown below:

Claim 1, Column 7, Line 64
    Change "treting" to read --treating--.

Signed and Sealed this

Fifteenth Day of November, 1994

Attest:

BRUCE LEHMAN

Attesting Officer     *Commissioner of Patents and Trademarks*